(12) United States Patent
Loy et al.

(10) Patent No.: US 7,051,432 B2
(45) Date of Patent: May 30, 2006

(54) METHOD FOR PROVIDING AN ELECTRICAL CONNECTION

(75) Inventors: Garry M. Loy, Raleigh, NC (US); Kenneth C. Shuey, Zebulon, NC (US)

(73) Assignee: Elster Electricity, LLC, Raleigh, NC (US)

( * ) Notice: Subject to any disclaimer, the term of this patent is extended or adjusted under 35 U.S.C. 154(b) by 0 days.

(21) Appl. No.: 10/813,841

(22) Filed: Mar. 31, 2004

(65) Prior Publication Data

US 2005/0223553 A1   Oct. 13, 2005

(51) Int. Cl.
*H05K 3/30* (2006.01)
(52) U.S. Cl. .......................... 29/837; 29/741; 29/739; 29/832; 29/838; 324/114; 324/134; 361/659; 361/668
(58) Field of Classification Search ................. 29/852, 29/833, 837, 741; 324/142, 141, 144, 134, 324/114, 74, 723, 714; 361/659, 664, 666, 361/667, 668
See application file for complete search history.

(56) References Cited

U.S. PATENT DOCUMENTS

| | | | | | |
|---|---|---|---|---|---|
| 3,924,918 | A | * | 12/1975 | Friend | 439/75 |
| 3,973,322 | A | * | 8/1976 | Boynton | 29/837 |
| 4,749,943 | A | * | 6/1988 | Black | 324/754 |
| 4,757,600 | A | * | 7/1988 | Holcomb | 29/566.3 |
| 6,838,867 | B1 | * | 1/2005 | Loy | 342/142 |

* cited by examiner

*Primary Examiner*—Rick Kiltae Chang
(74) *Attorney, Agent, or Firm*—Woodcock Washburn LLP

(57) ABSTRACT

A preferred method for electrically connecting a first and a second component includes inserting a wire pin through a through hole formed in the first component so that a first portion of the wire pin is located within the through hole and a second portion of the wire pin is located within a retaining feature formed at least in part by the second component. The preferred method also includes moving one of the first and the second components in relation to the other of the first and the second components so that the wire pin resiliently deflects thereby establishing a first contact force between the first portion of the wire and the first component, and a second contact force between the second portion of the wire and the second component.

21 Claims, 5 Drawing Sheets

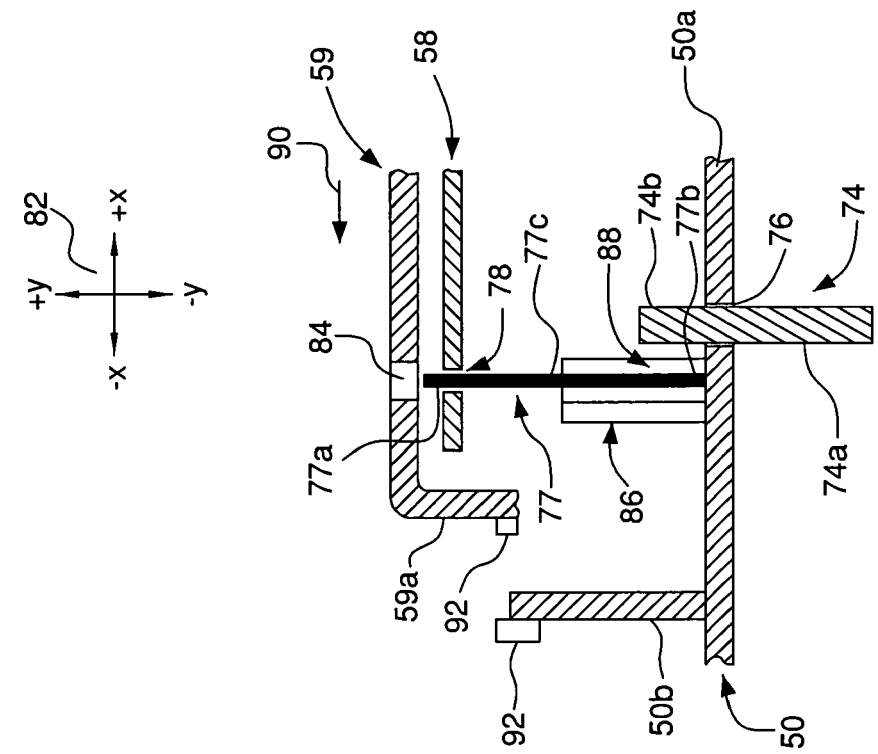
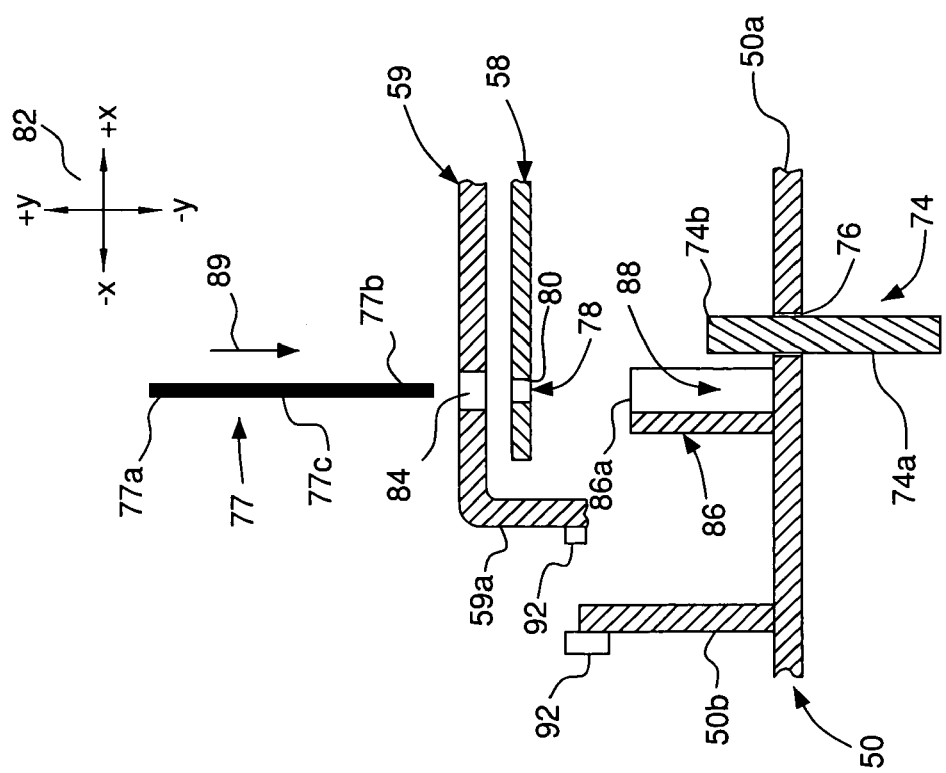

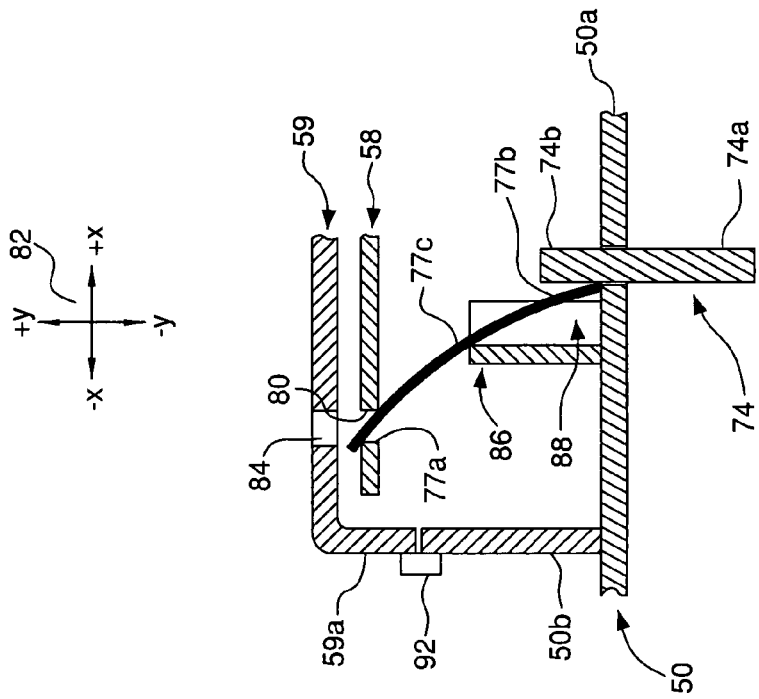
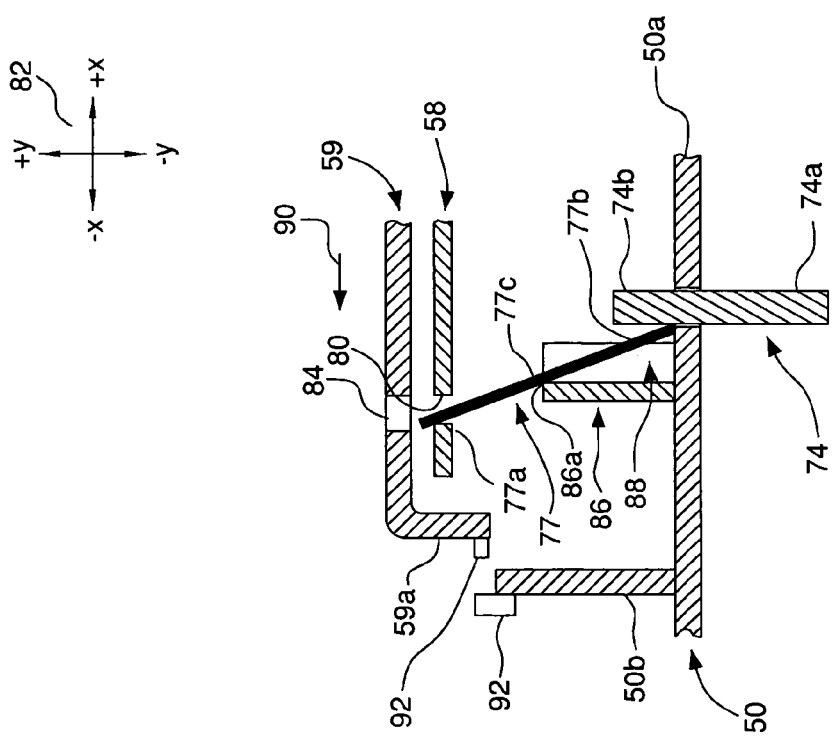
FIG. 2D
FIG. 2C

METHOD FOR PROVIDING AN ELECTRICAL CONNECTION

FIELD OF THE INVENTION

The present invention relates to a method for electrically interconnecting two or more components.

BACKGROUND OF THE INVENTION

Manufactured products that perform electrical functions often include two or more electrically-connected components such as circuit boards, displays, external connections, etc. The electrical connection between components is typically achieved using techniques such as soldering (or other conduction reflow processes); flexible wires with connectors attached to the ends thereof; flexible printed circuits equipped with special connectors or electrically-conductive adhesive; rigid pins and receptacles; arrays of springs mounted in a housing clamped between the electrically-connected components; etc.

The above-noted techniques can present disadvantages. For example, the process of installing flexible wires between two electrical components can be difficult to automate. Other techniques can more readily be automated. Achieving such automation, however, can be relatively expensive, and may not be cost-effective in low-volume production runs. Moreover, electrical connections that incorporate solder or adhesive can make it difficult to disassemble the interconnected components. The formation of solder connections can introduce process variables that must be closely controlled, thereby increasing the complexity and cost of the assembly process.

SUMMARY OF THE INVENTION

A preferred method for electrically connecting a first and a second component comprises inserting a wire pin through a through hole formed in the first component so that a first portion of the wire pin is located within the through hole and a second portion of the wire pin is located within a retaining feature formed at least in part by the second component.

A preferred method also comprises moving one of the first and the second components in relation to the other of the first and the second components so that the wire pin resiliently deflects thereby establishing a first contact force between the first portion of the wire pin and the first component, and a second contact force between the second portion of the wire pin and the second component.

Another preferred method for electrically connecting a first and a second component comprises substantially aligning a first through hole formed in the first component with one of a second through hole formed in the second component and a pocket formed at least in part by the second component, and inserting a wire pin through the first through hole in a first direction so that a first portion of the wire pin is located within the first through hole and a second portion of the wire pin is located within one of the second through hole and the pocket A preferred method also comprises moving one of the first and the second components in a second direction in relation to the other of the first and the second components, the second direction being substantially perpendicular to the first direction, thereby causing one of the first and second portions of the wire pin to move in relation to the other of the first and second portions of the wire pin.

A preferred method for establishing electrical contact between a first and a second component comprises substantially aligning a first retaining feature defined at least in part by the first component with a second retaining feature defined at least in part by the second component so that the first and second retaining features can each receive a respective portion of a wire pin.

A preferred method also comprises substantially misaligning the first and second retaining features after the first and second retaining features have each received the respective portions of the wire pin so that the first and second components bend the wire pin and thereby establish contact forces between the first component and the wire pin, and the second component and the wire pin.

Another preferred method for electrically connecting a first and a second component comprises inserting a wire pin through a first retaining feature formed at least in part by the first component so that a first portion of the wire pin is located within the first retaining feature and a second portion of the wire pin is located within a retaining feature formed at least in part by the second component A preferred method also comprises moving one of the first and the second components in relation to the other of the first and the second components so that the first component engages the first portion of the wire pin by way of the first retaining feature, and the second component engages the second portion of the wire pin by way of the second retaining feature thereby causing the first portion of the wire pin to move in relation to the second portion of the wire pin and bending the wire pin.

A preferred method for electrically connecting a first, a second, and a third component comprises inserting a wire pin through respective through holes formed in the first and second components so that a first portion of the wire pin is located within the through hole formed in the first component, a second portion of the wire pin is located within the though hole formed in the second component, and a third portion of the wire pin is located in a retaining feature formed at least in part by the third component.

A preferred method also comprises moving the second component in relation to the first and the third components so that the wire pin resiliently deflects thereby establishing a first contact force between the first portion of the wire pin and the first component, a second contact force between the second portion of the wire pin and the second component, and a third contact force between the third portion of the wire pin and the third component.

A preferred embodiment of an electrical energy meter comprises a base for mounting on a supporting surface, and a current sensor assembly comprising a plurality of contact blades extending through the base for electrically contacting a conductor of electrical energy, and a current transformer mechanically coupled to the base and electrically coupled to the contact blades. The current transformer produces an electrical output proportional to an electrical current in the conductor of electrical energy.

A preferred embodiment also comprises a printed circuit board for calculating a cumulative amount of electrical energy passing through the conductor of electrical energy based on the electrical output of the current transformer and a voltage of the conductor of electrical energy, and a contact blade electrically coupled to the printed circuit board by a wire pin.

The wire pin engages retaining features defined at least in part by the respective printed circuit board and contact blade. The retaining features are substantially misaligned so that the wire pin is bent and contact forces are thereby established between the wire pin and the printed circuit board, and between the wire pin and the contact blade.

BRIEF DESCRIPTION OF THE DRAWINGS

The foregoing summary, as well as the following detailed description of a presently-preferred embodiment, is better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings:

FIG. 2A is a cross-sectional side view of a PCB, a contact blade, a PCB housing, a base, and a wire pin of the electrical-energy meter shown in FIG. 1, with the wire pin about to be inserted through the PCB and the PCB housing;

FIG. 2B is a cross-sectional side view of the PCB, contact blade, PCB housing, base, and wire pin shown in FIG. 2A, after the wire pin has been inserted through the PCB and the PCB housing and into a pocket of the base;

FIG. 2C is a cross-sectional side view of the PCB, contact blade, PCB housing, base, and wire pin shown in FIGS. 2A and 2B, after the PCB and PCB housing have been moved laterally in relation to the base and contact blade;

FIG. 2D is a cross-sectional side view of the PCB, contact blade, PCB housing, base, and wire pin shown in FIGS. 2A–2C, after the PCB and PCB housing have been further moved laterally in relation to the base and contact blade to bend the wire pin;

DESCRIPTION OF PREFERRED METHODS

A preferred method for providing an electrical connection is described herein. The preferred method, as described herein, is used to establish an electrical connection between a printed circuit board (PCB) 58 and an electrically-conductive contact blade 74 of an electrical-energy meter 14 (see FIG. 1). The preferred method is described in relation to these particular components for exemplary purposes only.

The preferred method can be used to electrically connect other types of components, in other types of electrical devices or systems.

Figure 1:
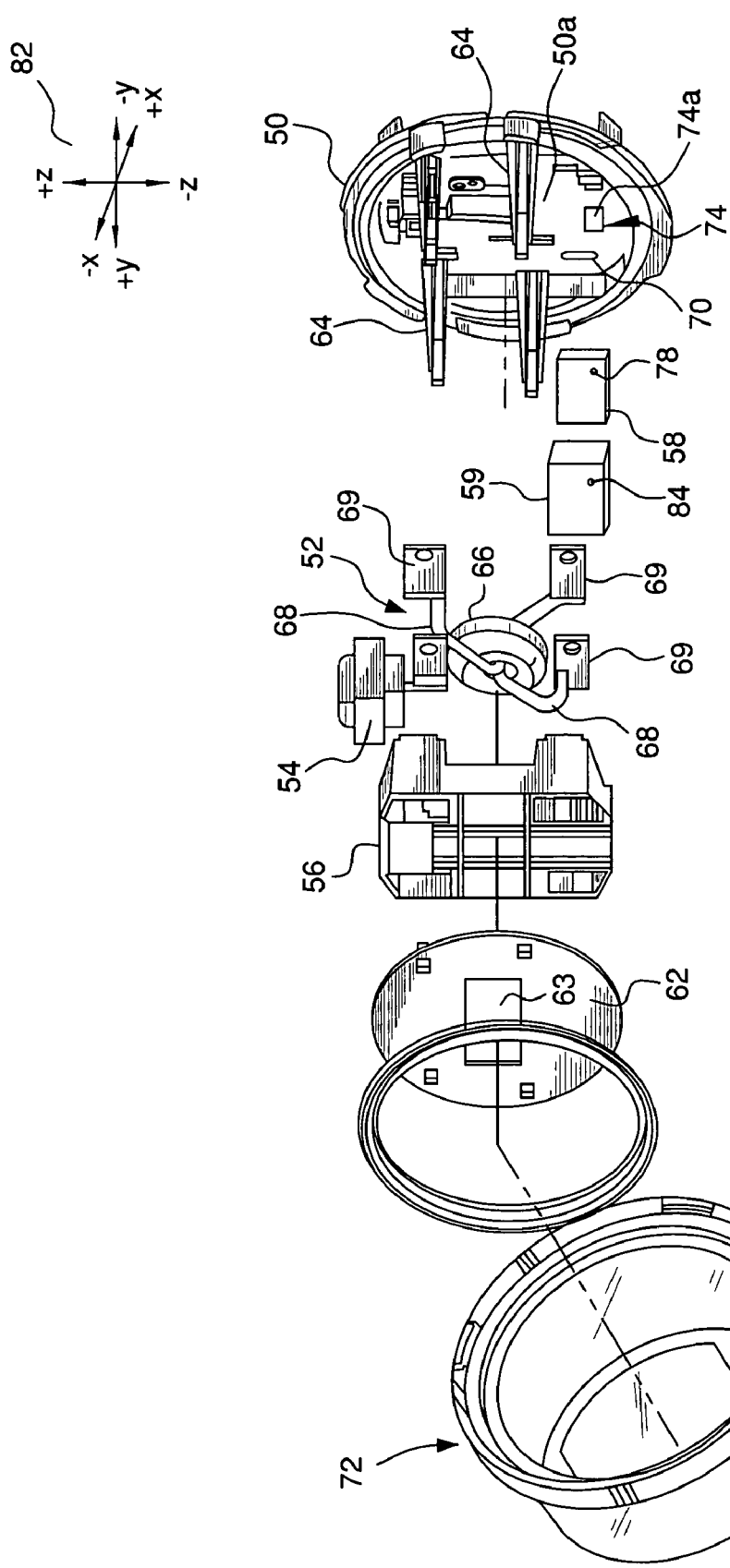
FIG. 1 is an exploded perspective view of an electrical-energy meter having a printed circuit board (PCB) and a contact blade that can be electrically connected in accordance with a preferred method in accordance with the present invention.

The electrical-energy meter 14 comprises a base 50, a current sensor assembly 52, and a power transformer 54 (see FIG. 1). The current sensor assembly 52 and the power transformer 54 are mounted on the base 50 by way of a retainer 56. The electrical-energy meter 14 also includes the PCB 58, a PCB housing 59, a name plate 62, and a digital display 63 mounted on the name plate 62. The name plate 62 is mounted on snap posts 64 formed in the base 50.

The current sensor assembly 52 comprises an annular current sensor 66, current conductors 68 that conduct electrical current to the current sensor 66, and meter blades 69 connected to opposite ends of each current conductor 68. The meter blades 69 are retained in the base 50 by way of keyhole slots 70 formed in a major portion 50a of the base 50.

Each of the meter blades 69 slidably and securely engages a corresponding receptacle (not shown) mounted on the residential or commercial establishment in which the electrical-energy meter 14 is used. The engagement of the blades 69 and the corresponding receptacles electrically couples the electrical-power meter 14 to the conductor that supplies electrical power to the residential or commercial establishment.

The current sensor 66 is electrically coupled to the PCB 58, and measures the electrical current flowing through the electrical-power meter 14 by way of the current conductors 68 and the meter blades 69. The meter blades 69 are electrically coupled to the PCB 58 through the output of the current sensor (66). The PCB 58 thus receives a voltage input that is proportional to the voltage of the conductor that supplies electrical power to the residential or commercial establishment. The PCB 58 calculates the total (cumulative) watt-hours of power that have passed through the electrical-energy meter 14 over time based on the measured current and the voltage input, using conventional techniques known to those skilled in the field of electrical-energy meter design. The PCB 58 continually updates the cumulative watt-hours, and displays the updated value on the digital display 63.

The current sensor assembly 52, power transformer 54, PCB 58, name plate 62, and digital display 63 are housed within a cover 72.

The electrical-energy meter 14 includes a plurality of the contact blades 74 (see FIGS. 1–2D; only one of the contact blades 74 is depicted in FIG. 1, for clarity). The contact blades 74 are mounted in slots 76 formed in the major portion 50a of the base 50. The contact blades 74 are electrically connected to the PCB 58, as discussed below.

A first portion 74a of each contact blade 74 extends downward (in the "–y" direction) from the major portion 50a of the base 50 (from the perspective of FIGS. 2A–2D). The first portion slidably and securely engages a corresponding receptacle (not shown) mounted on the residential or commercial establishment in which the electrical-energy meter 14 is used. The engagement of the blades 74 and the corresponding receptacle facilitates the transmission of electrical energy through the electrical energy meter 14 to the residential or commercial establishment.

Specific details of the electrical-energy meter 14 are presented for exemplary purposes only. The present invention can be applied to other types of electrical-energy meters, and to other types of devices and systems.

The PCB 58 and the contact blades 74 are electrically connected using an electrically-conductive wire pin 77 (see FIGS. 2A–2D). A first end portion 77a of the wire pin 77 is positioned in a through hole 78 formed in the PCB 58 when the wire pin 77 is in its installed position, i.e., in the position depicted in FIG. 2D. The through hole 78 is defined by a surface 80 of the PCB 58. The through hole 78 is a plated through hole. In other words, the surface 80 is covered by an electrically-conductive coating. The through hole 78 acts as a retaining feature for the wire pin 77, as discussed below.

A second end portion 77b of the wire pin 77 is positioned against the contact blade 74 when the wire pin 77 is in its installed position.

The through hole 78 and the contact blade 74 are substantially misaligned with respect to the vertical ("y") direction, i.e., the through hole 78 is offset from the contact blade 74 in the "x" direction, when the wire pin 77 is in its installed position. (The figures are referenced to a common coordinate system 82 depicted therein.) This misalignment creates a contact force between the surface 80 of the PCB 58 and the first end portion 77a of the wire pin 77. The misalignment also creates a contact force between the second end portion 77b of the wire pin 77 and the contact blade 74. The contact forces help to establish electrical contact between the wire pin 77 and the PCB 58, and between the wire pin 77 and the contact blade 74. The contact forces also help to retain the wire pin 77 in its installed position.

Details relating to the installation of the wire pin 77 are as follows.

The PCB 58 is fixedly coupled to the PCB housing 59 by a suitable means such as fasteners (not shown). The PCB housing 59 has a through hole 84 formed therein. The through hole 84 is substantially aligned with the through hole 78 in the PCB 58.

A second portion 74b of the contact blade 74 extends upward (in the "+y" direction) from the major portion 50a of the base 50 (from the perspective of FIGS. 2A–2D. The base 50 includes a projection 86 that extends upward from the major portion 50a (the projection 86 is not shown in FIG. 1, for clarity). The projection 86 is located proximate the second portion 74b of the contact blade 74, and is offset from the second portion 74b in the "x" direction. The projection 86 and the second portion 74b define a pocket 88 therebetween. The pocket 88 acts as a retaining feature for the wire pin 77, as discussed below.

The wire pin 77 is installed by positioning the PCB 58 and the PCB housing 59 as shown in FIG. 2A. In particular, the PCB 58 and the PCB housing 59 are positioned so that the through holes 78, 84 are positioned over, and substantially align with the pocket 88.

The wire pin 77 is subsequently inserted through the through holes 78, 84, until the second end portion 77b enters the pocket 88 and abuts the major portion 50a of the base 50 (the direction of insertion is denoted by the arrow 89 in FIG. 2A). (The wire pin 77 can be inserted manually, or by a suitable automated device. The wire pin 77 can also be inserted by dropping the wire pin 77 through the through holes 78, 84.) The respective diameters of the wire pin 77 and the through holes 78, 84, and the width ("x" axis dimension) of the pocket 88 are preferably chosen so that the wire pin 77 can be freely inserted through the through holes 78, 84 and into the pocket 88.

The length of the wire pin 77 is preferably selected so that the wire pin 77 is positioned as shown in FIG. 2B when the wire pin 77 has been fully inserted through the through holes 78, 84. In particular, the first end portion 77a is positioned within and above the through hole 78, and below the through hole 84 when the wire pin 77 has been fully inserted (from the perspective of FIG. 2B).

A force is subsequently exerted on the PCB housing 59 to move the PCB housing 59 laterally, in the "−x" direction, in relation to the base 50. (The force can be exerted manually, or by a suitable automated device.) The PCB 58 is fixedly coupled to the PCB housing 59, as discussed above. The PCB 58 therefore moves with the PCB housing 59 (the direction of movement of the PCB 58 and the PCB housing 59 is denoted by the arrow 90 in FIGS. 2B, 2C).

The surface 80 of the PCB 58 urges the first end portion 77a of the wire pin 77 in the "−x" direction in response to the lateral movement of the PCB 58. The movement of the first end portion 77a causes a middle portion 77c of the wire pin 77 to contact an upper edge 86a of the projection 86, as shown in FIG. 2C.

The projection 86 restrains the middle portion 77c so that further lateral movement of the PCB 58 in relation of the base 50 causes the second end portion 77b to contact the second portion 74b upper portion 40a of the contact blade 74 (see FIG. 2C). In other words, the restraining effect of the projection 86 causes the wire pin 77 to pivot about the upper edge 86a in a counterclockwise direction (from the perspective of FIGS. 2b and 2C) until the second end portion 77b of the wire pin 77 contacts the second portion 74b of the contact blade 74.

Further lateral movement of the PCB 58 urges the first end portion 77a of the wire pin 77 in the "−x" direction, while the middle portion 77c and the second end portion 77b are restrained by the respective projection 86 and contact blade 74. The physical properties and the length to diameter ("L/D") ratio of the wire pin 77 are preferably selected so that the wire pin 77 can resiliently deflect (bend) in response to this combination of forces thereon, as shown in FIG. 2D. (The method provided by the present invention can be used in high or low voltage applications. Hence, the diameter of the wire pin 77 should also be selected on the basis of the current that is to be transmitted therethrough.)

The PCB 58 is moved in the lateral ("−x") direction until a side portion 59a of the PCB housing 59 substantially aligns with a corresponding side portion 50b of the base 50 with respect to the vertical ("y") direction, as shown in FIG. 2D. (The through hole 78 is substantially misaligned with the pocket 88 with respect to the vertical direction at this point.) The side portions 59a, 50b can each be equipped with suitable complementary locking features, such as latches 92, to secure the PCB housing 59 and the PCB 58 in position in relation to the base 50 once the side portions 59a, 50b have been aligned.

The wire pin 77 forms an electrically-conductive path between the PCB 58 and the contact blade 74. The resilience of the wire pin 77 helps to establish a contact force between the surface 80 of the PCB 58 and the first end portion 77a of the wire pin 77, and between the contact blade 74 and the contact blade 74.

The contact forces help to establish (and enhance) the electrical contact between the wire pin 77 and the PCB and contact blade 74. (The first end portion 77a contacts the surface 80 of the PCB 58 at two locations due to the angled orientation of the first end portion 77a in relation to the PCB 58, as depicted in FIG. 2D. Redundant contact points are thus established between the wire pin 77 and the PCB 58.)

Friction between the first end portion 77a of the wire pin 77 and the surface 80 of the PCB 58, and between the second end portion 77b and the contact blade 74, it is believed, helps to retain the wire pin 77 in its installed position. (The through hole 78 and the pocket 88 thus act as retaining features that facilitate retention of the wire pin 77 in its installed position.)

The deflection of the wire pin 77 should be limited to values that cause the material from which the wire pin 77 is formed to remain within its elastic limit as the wire pin 77 deflects. The wire pin 77 thus behaves as a spring that exerts a contact force proportional to the deflection thereof.

The contact force exerted by the wire pin 77 should be sufficient to establish adequate electrical contact between the wire pin 77 and the PCB 58 and contact blade 74. The contact force should also be sufficient to adequately retain the wire pin 77 in its installed position.

The contact force exerted by the wire pin 77 is related to the length-to-diameter ratio thereof, and to the hardness of the material from which the wire pin 77 is formed. The wire pin 77 is preferably formed from a material having relatively high hardness, conductivity, and corrosion resistance. For example, the wire pin 77 can be formed from non-annealed phosphor-bronze wire (the drawing process used to form with phosphor-bronze material into wire is believed to provide the phosphor-bronze material with the requisite hardness for use in this application). Alternatively, the wire pin 77 can be formed from materials such as stainless steel, copper, beryllium-copper, or other suitable materials.

The preferred method (and variants thereof) can be used to establish an electrical path between two or more components without the use of soldering or other conduction reflow processes. The preferred method, it is believed, does not require precise control of process variables, in contradistinction to conduction reflow processes. The preferred method can thus be implemented without the expense and complications associated with providing such control. Moreover, it is believed that the preferred method can be automated at a relatively low cost, thus making the use of the preferred method economically feasible for low-volume production runs.

Electrical connections formed in accordance with the preferred method can be disassembled with relative ease, unlike connections formed using solder or adhesive. Electrical connections formed in accordance with the preferred method are also believed to be more reliable than connections that rely on the use of solder or adhesive.

The preferred method can be used in lieu of electrical connectors and conventional flexible wires, extended rigid pins and corresponding receptacles, and spring arrays. The preferred method, it is believed, can provide electrical connections that are less expensive, have a lower parts count and footprint, and require less assembly effort than electrical connections provided by the noted techniques.

It is believed that the electrical connections provided by the preferred method are more reliable than connections formed using electrical connectors and conventional flexible wires, extended rigid pins and corresponding receptacles, and spring arrays. Moreover, such techniques can be difficult to automate. The preferred method, by contrast, can readily be performed on an automated basis in both high and low-volume production runs.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

Alternative methods within the scope of the present invention can be used to electrically connect two components having through holes formed therein for receiving the respective first and second end portions 77a, 77b of the wire pin 77. For example, an alternative version of the preferred method can be used to connect two of the PCBs 10. The wire pin 77 can be inserted through the through hole 78 of the upper PCB 58 so that the second end portion 77b of the wire pin 77 is positioned, in part, within the through hole 78 of the lower PCB 58, and the first end 77a is positioned, in part, within the through hole 78 of the upper PCB 58 (see FIG. 3A).

Figure 3B:
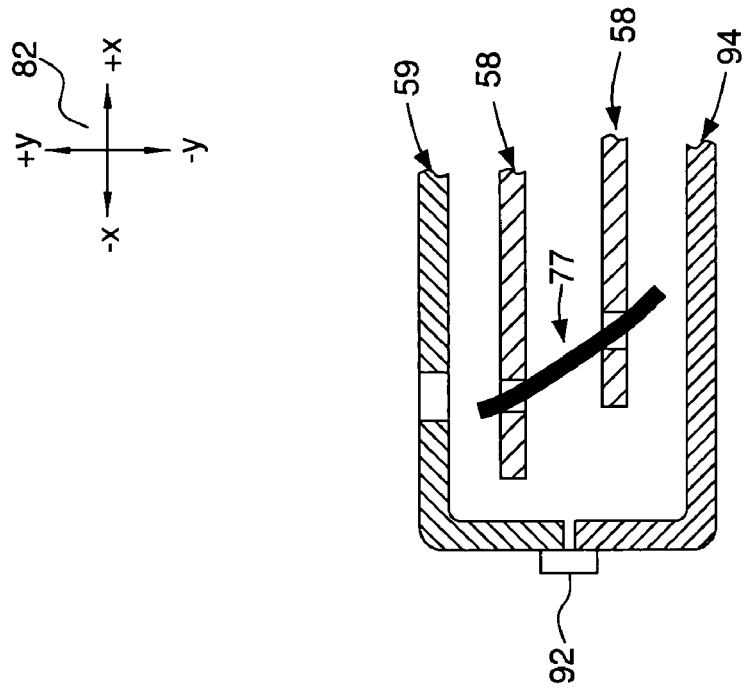
FIG. 3B is a cross-sectional side view of the first and second PCBs, first and second PCB housings, and wire pin shown in FIG. 3A, after the first PCB and first PCB housing have been moved laterally in relation to the second PCB and PCB housing to bend the wire pin.
Figure 3A:
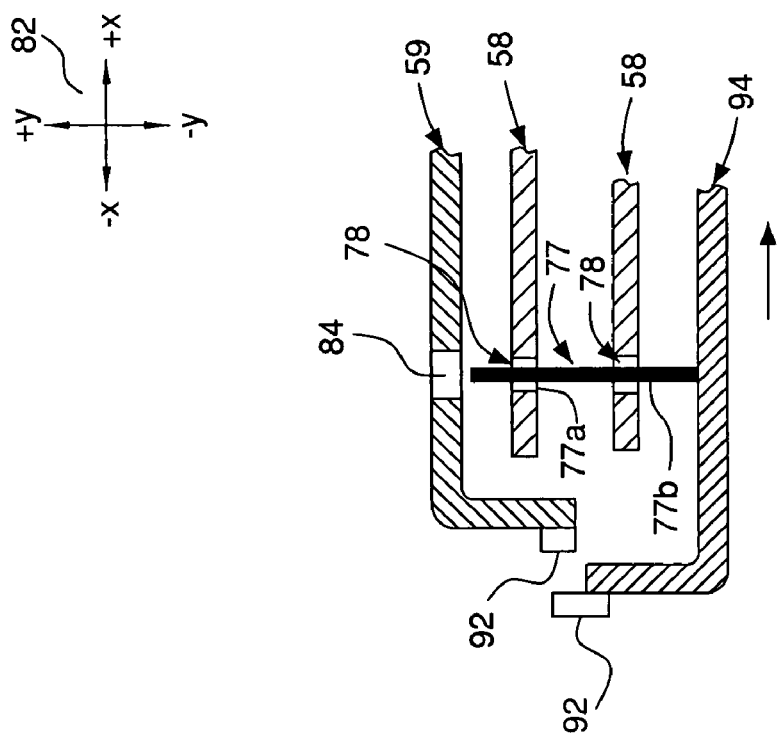
FIG. 3A a cross-sectional side view of a first and a second PCB, a first and a second PCB housing, and a wire pin of an alternative embodiment of the electrical-energy meter shown in FIGS. 1–2D, after the wire pin has been inserted through the first PCB housing and the first and second PCBs.

The lower PCB 58 is fixedly coupled to a PCB housing 94 that does not have one of the through holes 84 formed therein (the PCB housing 94 thus supports the wire pin 77 when the wire pin 77 positioned as depicted in FIG. 3A). The upper PCB 58 and its associated PCB cover 59 can be moved laterally (in the "−x" direction) to bend the wire pin 77 as shown in FIG. 3B, thereby establishing a contact force between the wire pin 77 and the upper and lower PCBs 58.

Other alternative methods within the scope of the present invention can be used to electrically connect three or more components. For example, FIGS. 4A and 4B depict a wire pin 96 that interconnects two of the PCBs 58 and one of the contact blades 74 (the wire pin 96 is longer than the wire pin 77, but is otherwise substantially identical to the wire pin 77).

Figure 4A:
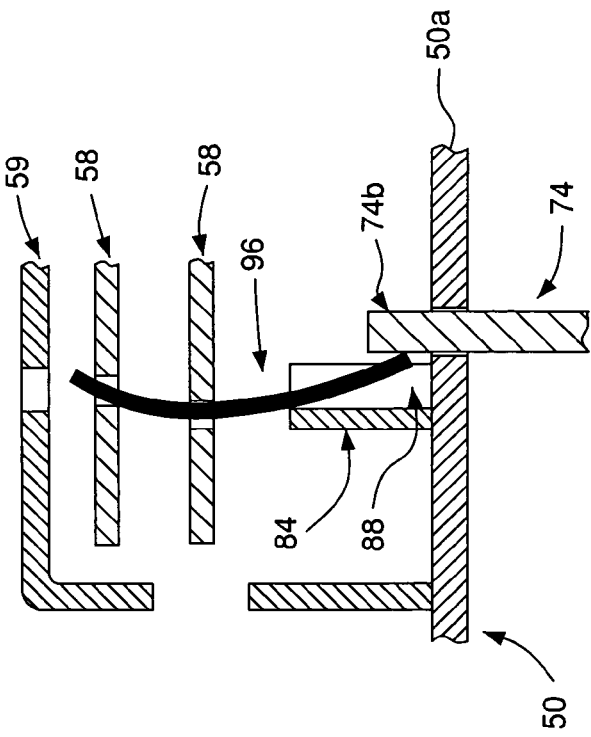
FIG. 4A is a cross-sectional side view of a first and a second PCB, a PCB housing, a base, a contact blade, and a wire pin of an alternative embodiment of the electrical-energy meter shown in FIGS. 1–2D, after the wire pin has been inserted through the first and second PCBs and the PCB housing, and into a pocket of the base.
Figure 4A:
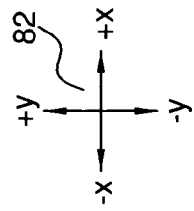
Figure 4B:
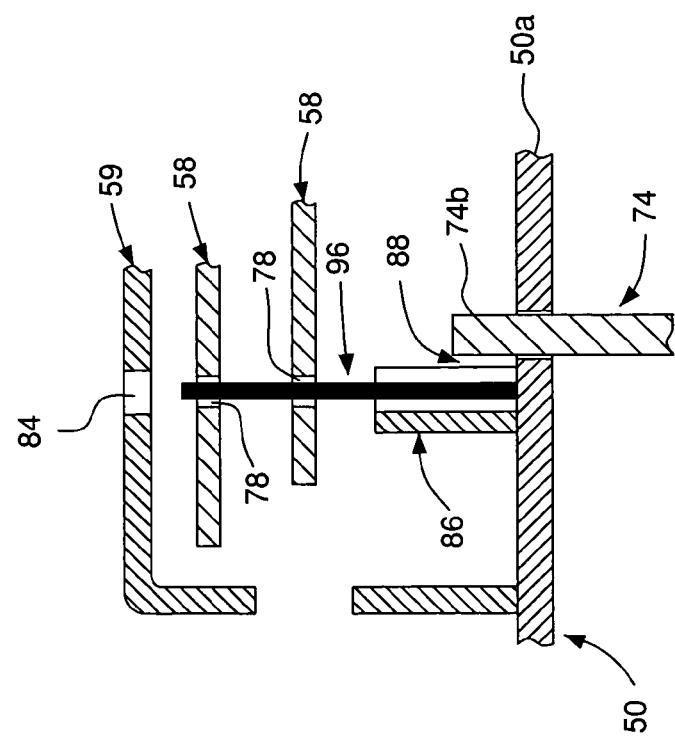
FIG. 4B is a cross-sectional side view of the first and second PCB, PCB housing, base, contact blade, and wire pin shown in FIG. 4A, after the second PCB has been moved laterally in relation to the first PCB, PCB housing, base, and contact blade to bend the wire pin.
Figure 4B:
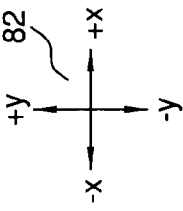

The wire pin 96 can be inserted through the through holes 78 in the PCBs 58, until reaching the position depicted in FIG. 4A. The lower PCB 58 can then be moved laterally (in the "−x" direction) to cause the wire pin 96 to resiliently deflect, thereby establishing contact forces between the wire pin 96 and the PCBs 10 and contact blade 74 (see FIG. 4B). (The lower PCB 58 does not have an associated PCB housing in this particular embodiment.)

What is claimed is:

1. A method for electrically connecting a printed circuit board of an electrical energy meter, and a second component, comprising:
   inserting a wire pin through a through hole formed in the printed circuit board of the electrical energy meter so that a first portion of the wire pin is located within the through hole and a second portion of the wire pin is located within a retaining feature formed at least in part by the second component; and
   moving one of the printed circuit board and the second component in relation to the other of the printed circuit board and the second component so that the wire pin resiliently deflects thereby establishing a first contact force between the first portion of the wire pin and the printed circuit board, and a second contact force between the second portion of the wire pin and the second component.

2. The method of claim 1, wherein the second component is a contact blade and the retaining feature is a pocket formed by the contact blade and a projection located proximate the contact blade.

3. The method of claim 2, wherein the projection is formed on a base of the electrical-energy meter.

4. The method of claim 1, wherein inserting a wire pin through a through hole formed in the printed circuit board comprises inserting the wire pin in a first direction, and moving one of the printed circuit board and the second component in relation to the other of the printed circuit board and the second component comprises moving the one of the printed circuit board and the second component in relation to the other of the printed circuit board and the second component in a second direction substantially perpendicular to the first direction.

5. The method of claim 1, wherein moving one of the printed circuit board and the second component in relation to the other of the printed circuit board and the second component so that the wire pin resiliently deflects comprises moving one of the printed circuit board and the second component in relation to the other of the printed circuit board and the second component so that the wire pin bends.

6. The method of claim 1, further comprising substantially aligning the through hole with the retaining feature before inserting the wire pin.

7. The method of claim 6, wherein the moving one of the printed circuit board and the second component in relation to the other of the printed circuit board and the second component so that the wire pin resiliently deflects comprises substantially misaligning the through hole and the retaining feature.

8. The method of claim 1, wherein the through hole is a plated through hole and the first contact force is established between the first portion of the wire and the plating of the through hole.

9. The method of claim 1, further comprising locking the one of the printed circuit board and the second component in position in relation to the other of the printed circuit board and the second component after moving the one of the printed circuit board and the second component in relation to the other of the printed circuit board and the second component.

10. The method of claim 1, wherein inserting a wire pin through a through hole formed in the printed circuit board comprises dropping the wire pin through the through hole.

11. The method of claim 1, wherein moving one of the printed circuit board and the second component in relation to the other of the printed circuit board and the second component so that the wire pin resiliently deflects comprises moving the one of the printed circuit board and the second component in relation to the other of the printed circuit board and the second component so that the first portion of the wire is restrained by the printed circuit board and the second portion of the wire is restrained by the second component thereby causing the first portion of the wire to move in relation to the second portion of the wire in response to the movement of the printed circuit board in relation to the second component.

12. The method of claim 2, wherein the projection and the contact blade restrain the wire pin when the one of the printed circuit board and the second component is moved in relation to the other of the printed circuit board and the second component.

13. The method of claim 12, wherein the projection and the contact blade restrain the wire pin so that the wire pin pivots about the projection.

14. A method for establishing electrical contact between a printed circuit board of an electrical energy meter and a second component, comprising:
substantially aligning a first retaining feature defined at least in part by the printed circuit board of the electrical meter with a second retaining feature defined at least in part by the second component so that the first and second retaining features can each receive a respective portion of a wire pin; and
substantially misaligning the first and second retaining features after the first and second retaining features have each received the respective portions of the wire pin so that the printed circuit board and the second component bend the wire pin and thereby establish contact forces between the printed circuit board and the wire pin, and the second component and the wire pin.

15. A method for electrically connecting a printed circuit board of an electrical energy meter and a second component, comprising:
inserting a wire pin through a first retaining feature formed at least in part by the printed circuit board of the electrical energy meter so that a first portion of the wire pin is located within the first retaining feature and a second portion of the wire pin is located within a retaining feature formed at least in part by the second component; and
moving one of the printed circuit board and the second component in relation to the other of the printed circuit board and the second component so that the printed circuit board engages the first portion of the wire pin by way of the first retaining feature, and the second component engages the second portion of the wire pin by way of the second retaining feature thereby causing the first portion of the wire pin to move in relation to the second portion of the wire pin and bending the wire pin.

16. A method for electrically connecting a first component and a contact blade, comprising:
inserting a wire pin through a through hole formed in the first component so that a first portion of the wire pin is located within the through hole and a second portion of the wire pin is located within a pocket formed by the contact blade and a projection formed on a base of an electrical energy meter and located proximate the contact blade; and
moving one of the first component and the contact blade in relation to the other of the first component and the contact blade so that the wire pin resiliently deflects thereby establishing a first contact force between the first portion of the wire pin and the first component, and a second contact force between the second portion of the wire pin and the contact blade.

17. A method for electrically connecting a first component of an electrical energy meter and a contact blade, comprising:
inserting a wire pin through a through hole formed in the first component of the electrical energy meter so that a first portion of the wire pin is located within the through hole and a second portion of the wire pin is located within a pocket formed by the contact blade and a projection located proximate the contact blade; and
moving one of the first component and the contact blade in relation to the other of the first component and the contact blade so that the wire pin resiliently deflects thereby establishing a first contact force between the first portion of the wire pin and the first component, and a second contact force between the second portion of the wire pin and the contact blade.

18. A method for electrically connecting a first component of an electrical energy meter and a second component, comprising:
inserting a substantially straight wire pin through a through hole formed in the first component of the electrical energy meter so that a first portion of the wire pin is located within the through hole and a second portion of the wire pin is located within a retaining feature formed at least in part by the second component; and moving one of the first and the second components in relation to the other of the first and the second components so that the wire pin resiliently deflects thereby establishing a first contact force between the first portion of the wire pin and the first component, and a second contact force between the second portion of the wire pin and the second component.

19. The method of claim 18, wherein moving one of the first and the second components in relation to the other of the first and the second components comprises moving one of the first and the second components in relation to the other of the first and the second components while the wire pin is not fastened to the first component or the second component.

20. The method of claim 18, wherein:

inserting a substantially straight wire pin through a through hole formed in the first component comprises inserting the substantially straight wire pin through the through hole substantially in a first direction; and moving one of the first and the second components in relation to the other of the first and the second components comprises moving one of the first and the second components only in a direction substantially perpendicular to the first direction.

21. The method of claim 18, wherein moving one of the first and the second components in relation to the other of the first and the second components so that the wire pin resiliently deflects comprises moving one of the first and the second components in relation to the other of the first and the second components to cause the wire pin to contact each of the first and second components at two locations on each of the first and second components.

* * * * *

UNITED STATES PATENT AND TRADEMARK OFFICE
CERTIFICATE OF CORRECTION

PATENT NO. : 7,051,432 B2 Page 1 of 1
APPLICATION NO. : 10/813841
DATED : May 30, 2006
INVENTOR(S) : Garry M. Loy et al.

It is certified that error appears in the above-identified patent and that said Letters Patent is hereby corrected as shown below:

Column 1,
Line 60, after "pocket" insert -- . --.

Column 2,
Line 21, after "component" insert -- . --.
Line 37, delete "though" and insert -- through --.

Column 3,
Line 37, after "FIG. 3A" insert -- is --.

Column 6,
Line 22, delete "2*b*" and insert -- 2B --.

Column 9,
Lines 63-64, delete "electrical meter" and insert -- electrical energy meter --.

Signed and Sealed this

Second Day of January, 2007

JON W. DUDAS
*Director of the United States Patent and Trademark Office*